(12) United States Patent
Ma et al.

(10) Patent No.: US 10,763,154 B2
(45) Date of Patent: Sep. 1, 2020

(54) MEASUREMENT OF FLATNESS OF A SUSCEPTOR OF A DISPLAY CVD CHAMBER

(71) Applicant: Applied Materials, Inc., Santa Clara, CA (US)

(72) Inventors: Ying Ma, Castro Valley, CA (US); Yixi Tian, Santa Clara, CA (US); Shih Chang Chen, Santa Clara, CA (US); Jin Sun, Santa Clara, CA (US); Rodolfo Perez, Santa Clara, CA (US); Stanley Wu, San Ramon, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 165 days.

(21) Appl. No.: 16/114,558

(22) Filed: Aug. 28, 2018

(65) Prior Publication Data
US 2020/0071823 A1 Mar. 5, 2020

(51) Int. Cl.
*H01L 21/687* (2006.01)
*G01B 21/30* (2006.01)
(Continued)

(52) U.S. Cl.
CPC ...... *H01L 21/68785* (2013.01); *G01B 5/0004* (2013.01); *G01B 21/30* (2013.01); *H01L 21/67288* (2013.01); *H01L 21/68764* (2013.01)

(58) Field of Classification Search
USPC ..................................... 118/728; 156/345.51
See application file for complete search history.

(56) References Cited

U.S. PATENT DOCUMENTS

| 5,605,574 A * | 2/1997 | Tsunashima ........ C23C 16/4583 118/500 |
| 6,753,507 B2 * | 6/2004 | Fure .................. H01L 21/67103 118/724 |

(Continued)

FOREIGN PATENT DOCUMENTS

| KR | 10-2007-0079151 | 8/2007 |
| KR | 10-2009-0002582 A | 1/2009 |

OTHER PUBLICATIONS

International Search Report and Written Opinion dated Dec. 2, 2019 for Application No. PCT/US2019/046402.

*Primary Examiner* — Nathaniel J Kolb
(74) *Attorney, Agent, or Firm* — Patterson + Sheridan LLP

(57) ABSTRACT

The present disclosure relates to a flexible support to aid in a measurement of flatness of a susceptor. The flexible support has a first support block having a substantially flat upper surface and a lower surface having a first aperture formed therein. The flexible support further has a second support block having a substantially flat lower surface and an upper surface having a second aperture formed therein. The flexible support further has a support pin configured to be receivable in the first aperture and the second aperture, the support pin configured to retain the first support block and the second support block in a spaced apart relation while allowing restricted motion of the first support block relative to the second support block via deformation of the support pin. The flexible support further has a guide disposed between the first support block and the second support block, the guide configured to allow the first support block and the second support block to move axially relative to the guide.

20 Claims, 6 Drawing Sheets

(51) Int. Cl.
  *G01B 5/00*   (2006.01)
  *H01L 21/67*  (2006.01)

(56) References Cited

U.S. PATENT DOCUMENTS

| | | |
|---|---|---|
| 6,872,908 B2 | 3/2005 | Ootsuka et al. |
| 7,678,197 B2 | 3/2010 | Maki |
| 8,372,205 B2 | 2/2013 | Choi et al. |
| 2005/0220604 A1* | 10/2005 | Kurita .................. C03C 17/002 414/806 |
| 2006/0054090 A1* | 3/2006 | Kurita ............... H01L 21/68742 118/728 |
| 2006/0060145 A1 | 3/2006 | Van Den Berg et al. |
| 2008/0017117 A1* | 1/2008 | Campbell ......... H01L 21/68792 118/729 |
| 2008/0134814 A1 | 6/2008 | Kim et al. |
| 2009/0178620 A1 | 7/2009 | Juergensen et al. |
| 2011/0223838 A1* | 9/2011 | Duescher .............. B24B 37/107 451/28 |
| 2012/0028545 A1* | 2/2012 | Duescher ................ B24B 49/12 451/28 |
| 2014/0170785 A1 | 6/2014 | Kurita et al. |
| 2016/0010239 A1* | 1/2016 | Tong ....................... C30B 25/12 392/416 |

\* cited by examiner

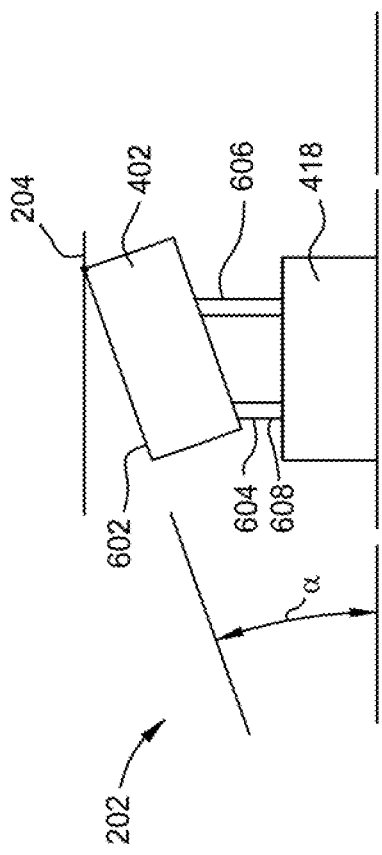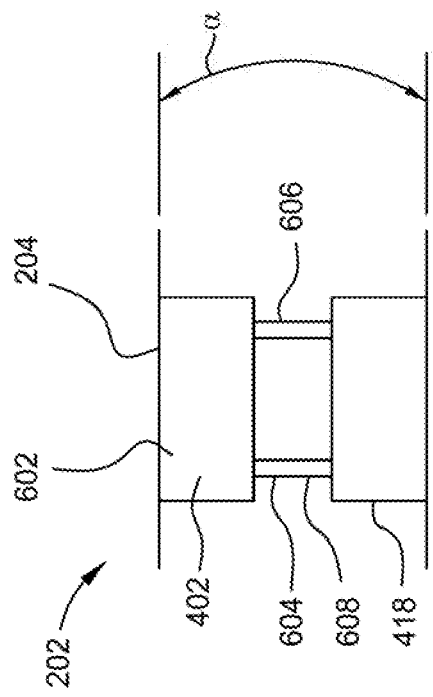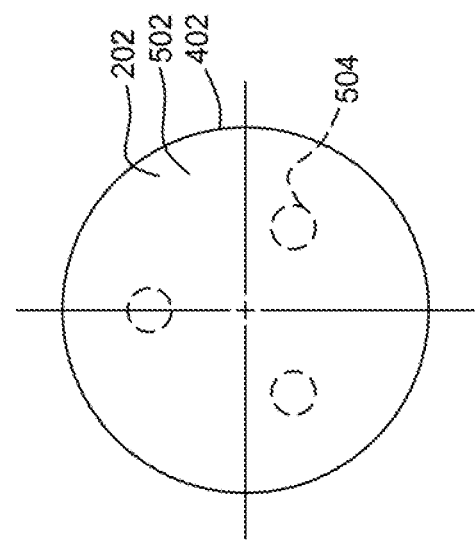

MEASUREMENT OF FLATNESS OF A SUSCEPTOR OF A DISPLAY CVD CHAMBER

BACKGROUND

Field

Embodiments of the present disclosure generally relate chemical vapor deposition (CVD) chamber for manufacturing displays. In particular, embodiments of the disclosure relate to a flexible support to aid in a measurement of flatness of a susceptor associated with the CVD chamber.

Description of the Related Art

Chemical vapor deposition (CVD) are generally employed to deposit thin films on substrates, such as solar panel substrates, organic light emitting diode (OLED) substrates, liquid crystal display (LCD) substrates and the like. These substrates can be fairly large and are substantially rectangular. Because of the large size of these substrates and underlying susceptor on which the substrates rest for processing, the substrates and the susceptor are susceptible to gravity induced non-uniformities in flatness.

FIG. 1 is a schematic cross-sectional view of an exemplary CVD system 100. The CVD system 100 generally includes a chemical vapor deposition chamber 102 coupled to a precursor supply 122. The chemical vapor deposition chamber 102 has sidewalls 104, a bottom 106, and a lid assembly 108 that define a processing volume or region 110 inside the chamber 102 and form a chamber body 120. The sidewalls 104 are oriented at substantially right angles to form a substantially rectangular processing region 110 to match the substantially rectangular substrates 112 to be processed.

The processing region 110 is typically accessed through a port (not shown) in the sidewalls 104 that facilitate movement of a substrate 112 into and out of the chemical vapor deposition chamber 102. The sidewalls 104 and bottom 106 are typically fabricated from aluminum, stainless steel, or other materials compatible with processing. The sidewalls 104, bottom 106, and lid assembly 108 define the chamber body 120.

A gas inlet conduit or pipe 118 extends into an entry port or first inlet 124 in a central lid region of the chamber body 120 and is connected to sources of various precursor gases. A precursor supply 122 contains the precursors that are used during deposition. The precursors may be gases or liquids. The process gases flow through the inlet pipe 118 into the first inlet 124 and then into the chamber 102. An electronically operated valve and flow control mechanism 126 controls the flow of gases from the gas supply into the first inlet 124. Spent precursor gasses are evacuated from the chamber body 120 through an output port 116 that is connected to a vacuum pump (not shown).

The lid assembly 108 provides an upper boundary to the processing region 110. The lid assembly 108 includes a central lid region in which the first inlet 124 is defined. The lid assembly 108 typically can be removed or opened to service the chemical vapor deposition chamber 102. A gas distribution assembly 128 is coupled to an interior underside 130 of the lid assembly 108 in the central lid region. The gas distribution assembly 128 includes a perforated showerhead 134 in a gas distribution plate 136 through which gases, including reactive species generated by the remote plasma source and processing gases for chemical vapor deposition, are delivered to the processing region 110. The perforated area 138 of the gas distribution plate 136 is configured to provide uniform distribution of process gases passing through the gas distribution assembly 128 into the process volume 110. The gas distribution plate 136 is substantially rectangular to match the generally rectangular substrate 112.

A support assembly 142 supports a generally rectangular substrate 112 during processing. In one embodiment, the support assembly 142 comprises a susceptor 144 having an aluminum body that encapsulates at least one embedded heater 146. The heater 146, such as a resistive element, disposed in the support assembly 142, is coupled to an optional power source 148 and controllably heats the support assembly 142 and the substrate 112 positioned thereon to a predetermined temperature.

The susceptor 144 comprises a lower surface 150 and an upper surface 152. The upper surface 152 supports the substrate 112. The lower surface 150 has a stem 154 coupled thereto. The stem 154 couples the support assembly 142 to a lift system (not shown) that moves the support assembly 142 between an elevated processing position (as shown) and a lowered position that facilitates substrate transfer to and from the chemical vapor deposition chamber 102. The stem 154 additionally provides a conduit for electrical and thermocouple leads between the support assembly 142 and other components of the system 100.

The support assembly 142 generally is grounded such that RF power supplied by a power source 158 and a matching circuit 159 to the gas distribution assembly 128 positioned between the lid assembly 108 and support assembly 142 (or other electrode positioned within or near the lid assembly of the chamber) may excite gases present in the processing region 110 between the support assembly 142 and the gas distribution assembly 128. The support assembly 142 additionally supports a circumscribing shadow frame 160. Generally, the shadow frame 160 prevents deposition at the edge of the substrate 112 and support assembly 142 so that the substrate does not adhere to the support assembly 142. The support assembly 142 has a plurality of holes 162 disposed therethrough that accept a plurality of lift pins 164.

The susceptor 144 of a typical display CVD system can be as large as 3.5 m×3.5 m to accommodate substrates 112 of about the same size and shape as the susceptor 144. The flatness of the upper surface 152 of the susceptor 144 impacts uniformity of deposited film onto the substrate 112. In some applications, the susceptor 144 is so large that gravity causes deformation of the susceptor 144 in such a way as to impact yield of processed substrates 112. The susceptor 144 needs to conform to a pre-specified or requested profile within a flatness specification to ensure that films may be deposited uniformly, on the substrate 112. If the susceptor 144 does not conform to specifications, then deformations of deposited films results. The deformations are more pronounced when the susceptor 144 and the substrate 112 are subjected to high temperature because the susceptor 144 is made from aluminum, which becomes softer at high temperature.

To prevent sagging of the susceptor 144 due to gravity, the susceptor 144 may be provided with a ceramic plate assembly 170 supported by a plurality of reinforcements 172. The reinforcements 172 are placed at locations underneath a ceramic plate of the ceramic plate assembly 170 where gravity deforms the susceptor 144 at its greatest extent.

The susceptor 144 is inspected for flatness both at a susceptor manufacturer and when the susceptor 144 is tested during installation. During the susceptor manufacturing test, the susceptor 144 is placed on a highly flat granite table. The susceptor 144 is supported on the granite table with solid standoffs placed in the corresponding location of where the reinforcements 172 will contact the susceptor 114 when the susceptor 114 is later installed in the CVD chamber 102. A Hamar laser 210 scans over various locations on the top of the susceptor 144 to check for flatness. The flatness measurements are then taken and provided as specifications for an installer to check when installing the susceptor 144 in the CVD chamber 102 on-site.

Unfortunately, when the susceptor 144 is installed in a CVD chamber 102 on-site, the susceptor 144 may still be subject to additional deformation because the ceramic plate assembly 170 does not have the same rigidity of the granite table and standoffs utilized when testing by the manufacturer. Therefore, on-site (e.g., installed) measurements of susceptor flatness may differ significantly from manufacturer specifications. Although testing for susceptor flatness can be performed in-situ within the CVD system 100, it is not practical to test many different type of configurations of ceramic plate assemblies for different chambers.

SUMMARY

The present disclosure generally relates to a flexible support to aid in a measurement of flatness of a susceptor. The flexible support has a first support block having a substantially flat upper surface and a lower surface having a first aperture formed therein. The flexible support further has a second support block having a substantially flat lower surface and an upper surface having a second aperture formed therein. The flexible support further has a support pin configured to be receivable in the first aperture and the second aperture, the support pin configured to retain the first support block and the second support block in a spaced apart relation while allowing restricted motion of the first support block relative to the second support block via deformation of the support pin. The flexible support further has a guide disposed between the first support block and the second support block, the guide configured to allow the first support block and the second support block to move axially relative to the guide.

The present disclosure further relates to an apparatus for obtaining a flatness measurement of a susceptor. The apparatus comprises a substantially flat and hard table. The apparatus further comprises a plurality of flexible supports overlying the table. Each of the flexible supports comprises: a first support block having a substantially flat upper surface and a lower surface having a first aperture formed therein; a second support block having a substantially flat lower surface and an upper surface having a second aperture formed therein; a support pin configured to be receivable in the first aperture and the second aperture, the support pin configured to retain the first support block and the second support block in a spaced apart relation while allowing restricted motion of the first support block relative to the second support block via deformation of the support pin; and a guide disposed between the first support block and the second support block, the guide configured to allow the first support block and the second support block to move axially relative to the guide. The apparatus further comprises the susceptor overlying the plurality of flexible supports.

The present disclosure further relates to a method for obtaining a flatness measurement of a susceptor. The method comprises positioning a plurality of flexible supports overlying a substantially flat and hard table, wherein each of the flexible supports is configured to simulate a support assembly that supports the susceptor when in use in a processing chamber. The method further comprises disposing the susceptor on the flexible supports positioned on the table. The method further comprises measuring the flatness of the susceptor on the flexible supports.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 5 shows a top-down view of a flexible support as seen from a top surface of a first support block having a plurality of underlying apertures.

FIG. 6 is a side view of a flexible support when an overlying susceptor touches a first support block of the flexible support at a single point while leaving a space along an upper surface of the first support block.

FIG. 7 is a side view of a flexible support when an overlying susceptor touches a first support block of the flexible support at a multiple points while not leaving a space along an upper surface of the first support block.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
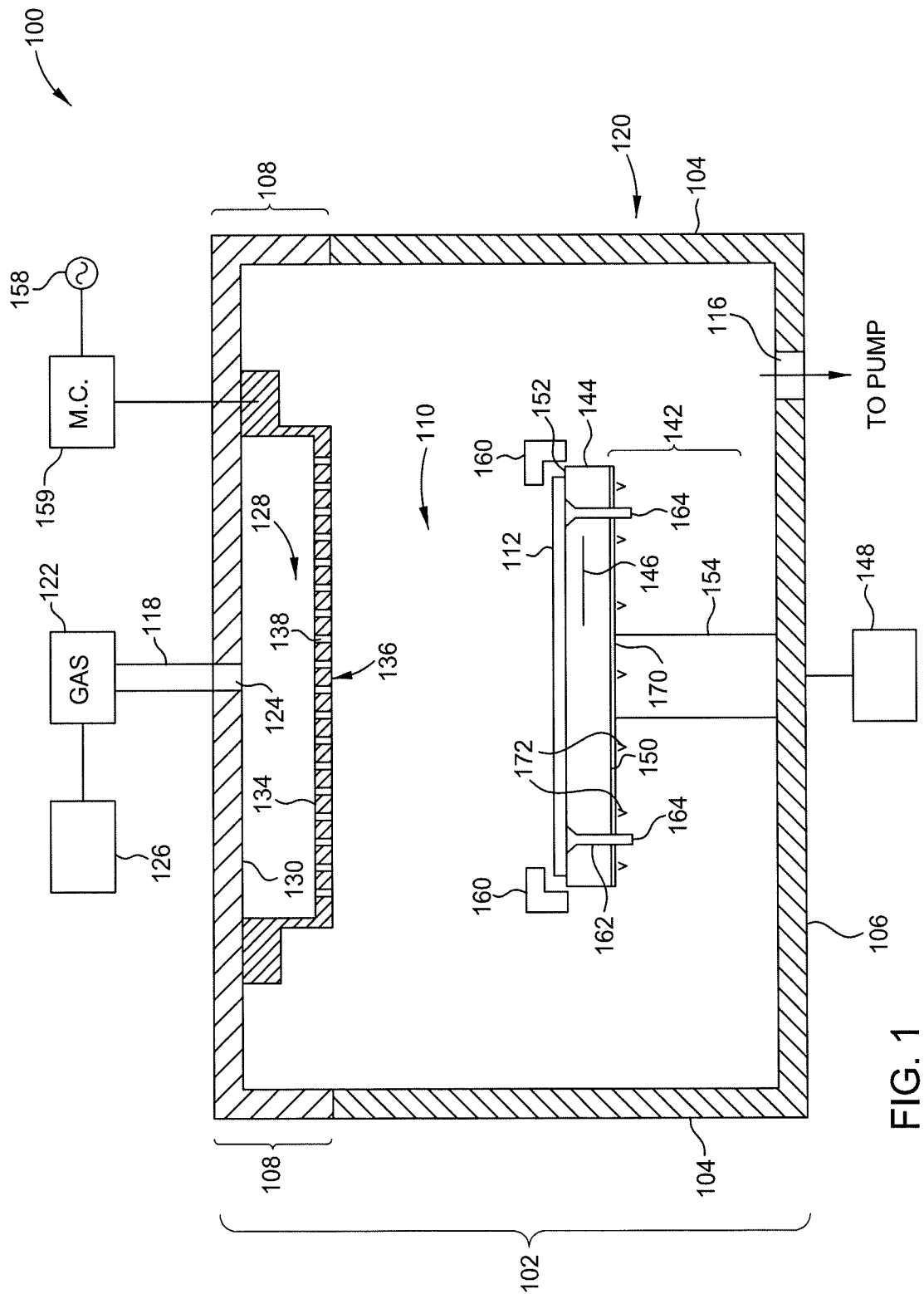
FIG. 1 is a schematic cross-sectional view of an exemplary display CVD system.
Figure 2:
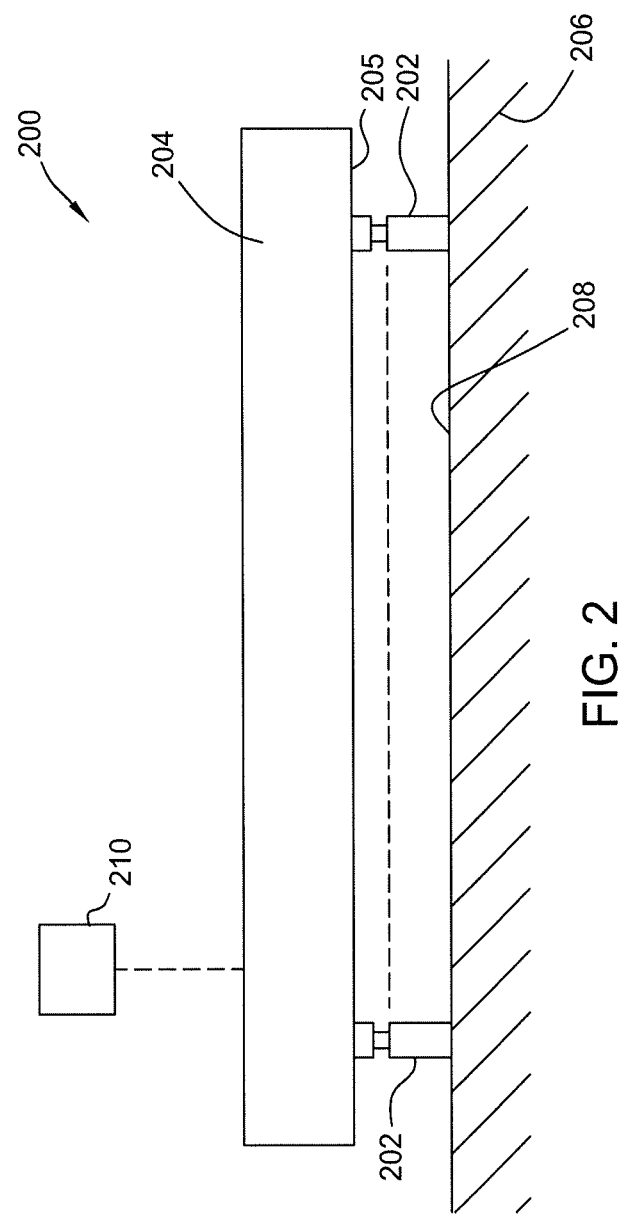
FIG. 2 illustrates a flatness measurement apparatus that employs flexible supports according to embodiments of the present disclosure.

FIG. 2 illustrates a flatness measurement apparatus 200 that employs flexible supports 202 according to embodiments of the present disclosure. The flatness measurement apparatus 200 provides a set of flexible supports 202 to aid in flatness measurements of a susceptor 204. Multiple flexible supports 202 support the susceptor 204 on a flat granite table 206. When gravity-induced deformations vary at different locations in the susceptor 204, the height and angle of the flexible supports 202 can be varied in three dimensions for more accurate readings of flatness. More specifically, the flexible supports 202 are configured to replicate the sag of the susceptor 204 when installed and supported by the ceramic plate assembly 170 in the CVD chamber 102. As utilized below, an "accurate measurement of flatness" is a measurement taken using the apparatus 200 that accurately replicates (i.e., predicts) a flatness measurement of the susceptor upon installation in the CVD chamber 102.

The plurality of flexible supports 202 are placed in predetermined positions between a bottom surface 205 of the susceptor 204 and an upper surface 208 of the flat granite table 206. The predetermined positions are selected based on the configuration of the ceramic plate assembly 170 that will support the susceptor 204 when installed in the CVD chamber 102. A Hamar laser 210 scans across different locations on an upper surface of the susceptor 204 to acquire a plurality of flatness measurements. Because of the weight of the susceptor 204, initially, the flexible supports 202 may be compressed in some locations and form a space between the susceptor 204 and other flexible supports 202 in other locations. The interaction between susceptor 204 and flexible supports 202 is very complex. Total deformation is determined by the rigidity of both the susceptor 204 and the flexible supports 202 and their interactions. When the weight of the susceptor 204 is applied to a flexible support 202 at one point, the flexible support 202 may be compressed and the susceptor 204 deforms correspondingly due to compression of the flexible support 202. Accordingly, the weight distribution of susceptor 204 among all of the flexible supports 202 is changed. A steady state of the apparatus is reached when the interactions between susceptor 204 and all of the flexible supports 202 reach a balanced state in term of compression and force.

Figure 4:
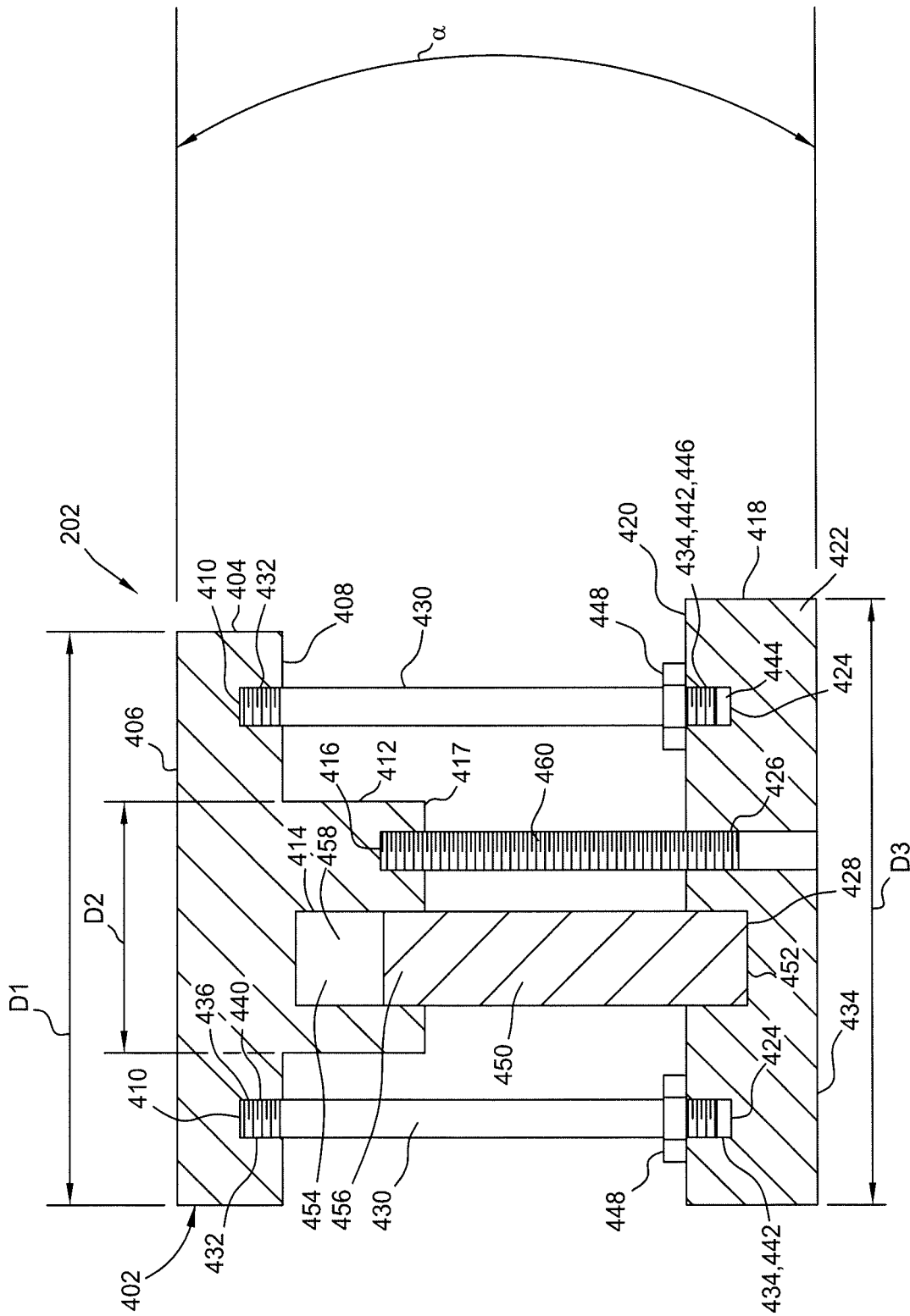
FIG. 4 is a side view of an exemplary flexible support, according to an embodiment.
Figure 8:
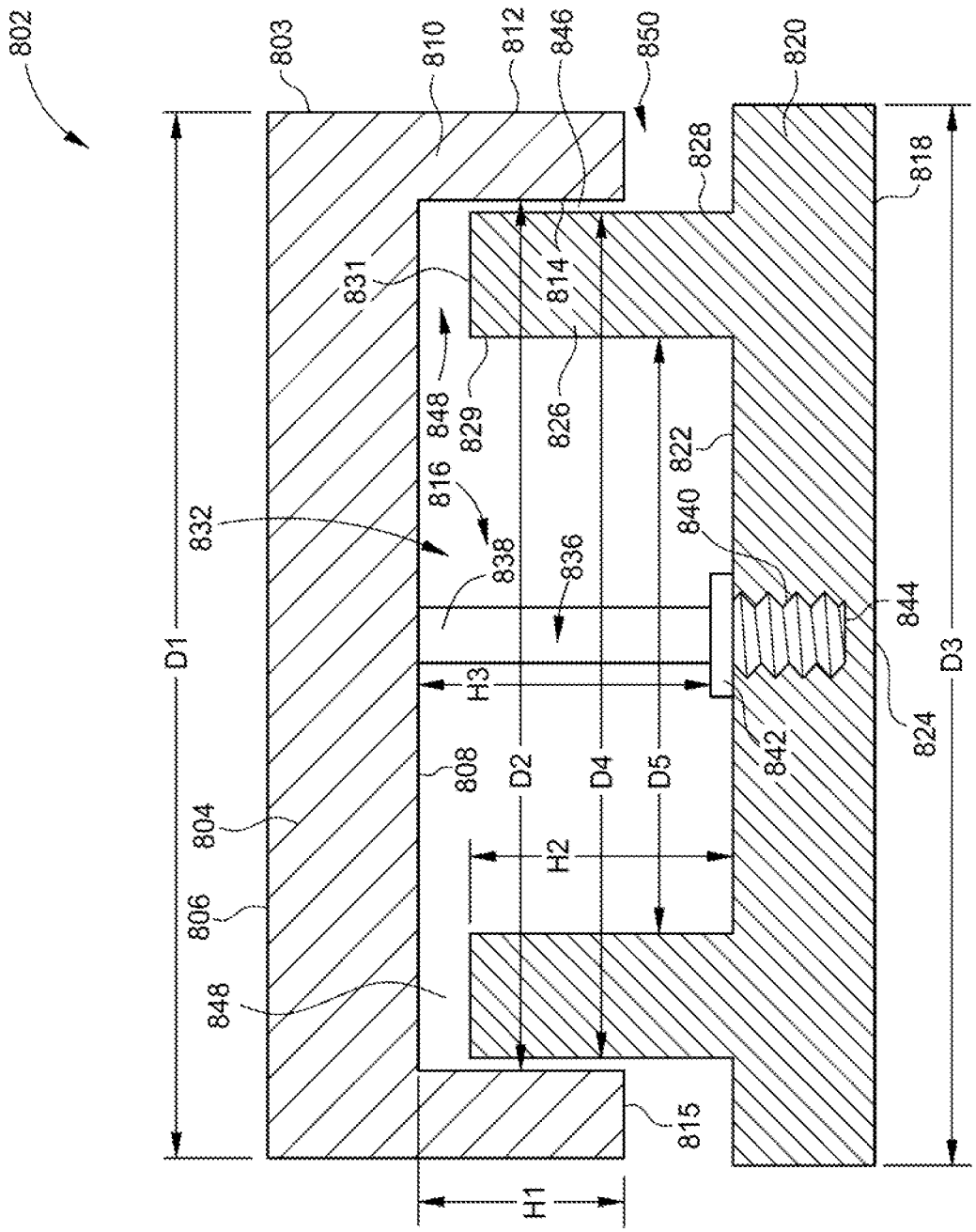
FIG. 8 is a side view of an exemplary flexible support, according to another embodiment.

The resulting flatness measurements translate to a degree of parallelism between the susceptor 204 and the upper surface 208 of the flat granite table 206. In the embodiment of FIG. 4, the flexible supports 202 are configured to be adjustable to change in height and angle relative to both the susceptor 204 and the flat granite table 206. In the embodiment of FIG. 8, the flexible supports 802 have a first support block 803 that pivots in three dimensions on a single support pin 836 that is elastically compressible and is receivable in a second support block 818. Thus, the flexible supports of FIGS. 4 and 8 permit the susceptor 204 to rest on all of the flexible supports 202 simultaneously such that the parallelism of the susceptor 204 to the flat granite table 206 can be set to near zero degrees and thereby providing an accurate measurement of flatness which will not deviate when installed in a CVD chamber.

Figure 3:
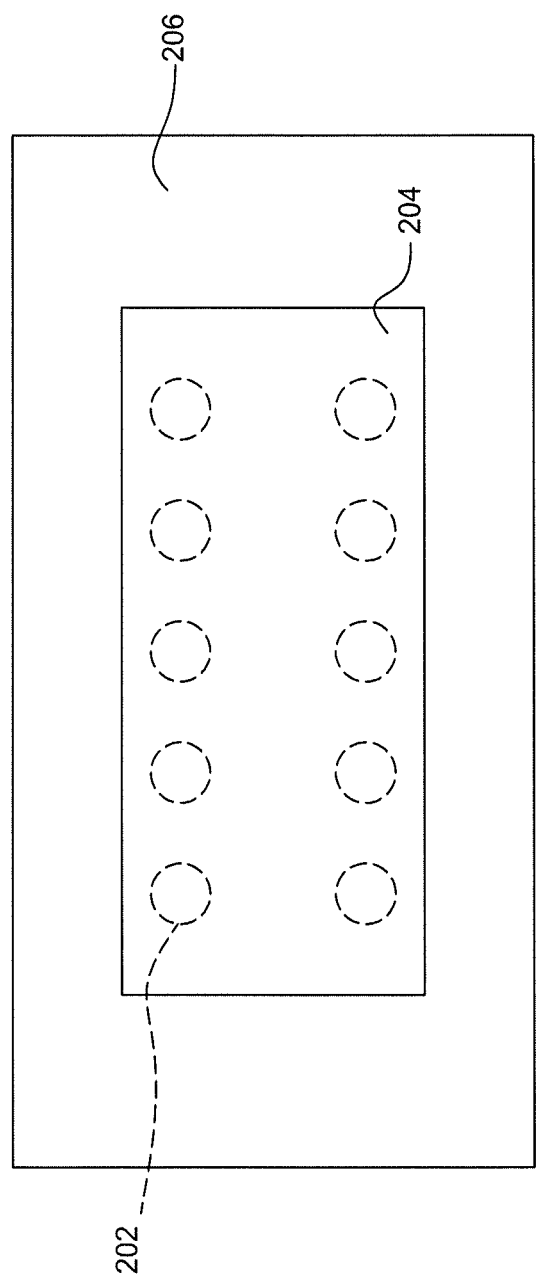
FIG. 3 is a top-down view of the flatness measurement apparatus of FIG. 2 that includes a susceptor, underlying plurality of flexible supports in phantom, and a granite table underlying the plurality of flexible supports.

FIG. 3 is a top-down view of the susceptor 204 disposed on the granite table 206. The flexible supports 202 are shown in phantom between the susceptor 204 and the granite table 206 underlying the susceptor 204. The number, location, height, and types of flexible supports 202 may be varied. Variations may be due to different generations and thus configurations the lead to different types of flexible supports 202. The flexible supports 202 may further vary by location/placement of the flexible supports 202, the number of flexible supports 202, and rigidity of the flexible supports 202. Accordingly, locations, numbers, and type of flexible supports 202 need to change to match the CVD chamber.

FIG. 4 is a side view of an exemplary flexible support 202, according to an embodiment. The flexible support 202 comprises a substantially cylindrical first support block 402. The first support block 402 has an upper cylindrical sub-block 404 of a first diameter D1. The upper sub-block 404 has a substantially flat upper surface 406 and a lower surface 408. The lower surface 408 is substantially parallel to the upper surface 406. The lower surface 408 also has a plurality of threaded apertures 410 formed therein. The upper sub-block 404 is disposed on a lower sub-block 412 having a smaller diameter D2 than the diameter D1 of the upper sub-block 404. The lower sub-block 412 has a lower surface 417 having a non-threaded aperture 414 and a threaded aperture 416 formed therein.

The flexible support 202 further comprises a substantially cylindrical second support block 418. The second support block 418 has an upper surface 420 and a lower surface 422. The upper surface 420 is substantially parallel to the lower surface 422. The second support block 418 has a diameter D3 which substantially matches the diameter D1 of the upper sub-block 404 of the first support block 402. The upper surface 420 of the second support block 418 has a plurality of threaded apertures 424, 426 and a non-threaded aperture 428 formed therein. The apertures 424, 426, 428 are positioned in the second support block 418 to align with corresponding apertures 410, 414, 416 in the first support block 402.

The flexible support 202 further comprises a plurality of support pins 430 that maintain the first support block 402 and the second support block 418 in a spaced-apart relation. The support pins 430 are configured to defect a pre-defined amount that enables the flexible support 202 to replicate the sag of the susceptor after installation in the CVD chamber for accurate measurement of susceptor flatness. In one example, the support pins 430 are configured to be threaded into the threaded apertures 410 of the upper sub-block 404 of the first support block 402 and the corresponding apertures 424 of the second support block 418. Each of the support pins 430 has an upper threaded section 432 that is configured to thread into a corresponding lower threaded section 434 of the threaded aperture 410. In an embodiment, once threaded into the threaded aperture 410, there is no space left between an upper end 436 of the support pin 430 and a lower internal surface 440 of the threaded aperture 410. The support pin 430 further has a lower threaded section 442 that is configured to thread into a corresponding aperture 424 of the second support block 418. In an initial position of the lower threaded section 442, there is generally a space 444 between the lower threaded section 442 and an internal surface 446 of the aperture 424.

The flexible support 202 further includes a plurality of threaded nuts 448 located about the support pin 430. The threaded nuts 448 function as a threaded stop to restrain the support pins 430 relative to the second support block 418. The position of the nuts 448 on the support pins 430 (e.g., a mechanical stop) is configured to set a distance between a portion of the first support block 402 and a corresponding portion of the second support block 418. The distance determines a deviation in parallelism between the upper surface 406 of the first support block 402 and the lower surface 422 of the second support block 418. The distance determines an acute angle α between a plane containing the upper surface 406 of the first support block 402 and a plane containing the lower surface 422 of the second support block 418.

The height of the space 444 may be adjusted by turning threaded nuts 448 located about the support pin 430. The height is changed to support different heights and angles of the flexible support 202 to obtain an accurate measurement of flatness. Additionally, the position of the nuts 448 along the support pins 430 may be varied until the first support block 402 and the second support block 418 do not touch when the support pins 430 are in compression. More particularly, if the applied force to the flexible supports 202 is beyond a design limit, and then support pins 430 yield, wherein the first support block 402 and the second support block 418 touch. Touching indicates that the position of the nuts 448 on the support pins 430 should be adjusted such that the nuts 448 are located higher along the support pins 430 to increase the distance between the first support block 402 and the second support block 418. The clearance of the first support block 402 and the second support block 418 are properly selected (generally 20-100 mils) to ensure the normal function of fixture compression and also prevent the susceptor 204 from sliding if yield occurs.

The support pins 430 are made of a material and geometry that provides a deflection while supporting the susceptor that enables the accurate measurement of flatness by the apparatus 200. The support pins 430 may be fabricated from a metal or other sufficiently rigid material. In one example, the support pins 430 are made of aluminum. The support pins 430 may be configured in different diameters and lengths selected to produce a desired deflection when testing a particular susceptor 204. Additionally, the size and the number of support pins 430 employed in a given flexible support 202 may be varied as needed to permit the flexible supports 202 to be used with different sizes, weights, and rigidity of different susceptor designs. In one embodiment, the number of flexible supports 202 may be varied for a specified chamber, ceramic plate assembly 170 and susceptor 204. The support pins 430 are replaceable with pins of different diameters and lengths to simulate different generations of susceptors 204 and accompanying chambers 102.

The flexible support 202 further comprises a large diameter guide 450 configured to be insertable in the non-threaded aperture 414 of the first support block 402 and the aperture 428 of the second support block 418. The guide 450 and the aperture 414 are not threaded to permit the guide 450 to movably slide within the aperture 414. The guide 450 is mounted at a bottom surface 452 of the aperture 428 and a space 454 is formed by an upper portion 456 of the guide 450 and an inner portion 458 of the aperture 414 in the first support block 402 to ensure that there are substantially no horizontal (lateral) movement components of the flexible support 202 while allowing the first support block 402 to move axially relative to the second support block 418 along the centerline of the guide 450.

The flexible support 202 further comprises a baseplate fastener screw 460 configured to fit into the aperture 416 in the first support block 402 and the threaded aperture 426 in the second support block 418. The baseplate fastener screw 460 functions to lock the first support block 402 and the second support block 418 together while not performing a flatness test, for example during transport or test setup, and is generally removed before the start of the flatness test.

FIG. 5 shows a top-down view of a flexible support 202 of FIG. 4 as seen from a top surface 502 of the first support block 402 having a plurality of underlying apertures 504. In the embodiment of FIGS. 4, the minimum number of threaded apertures to be employed with the support pins 430 and hence the minimum number of support pins 430 for a specific design of the flexible support 202 is two, but this permits adjustment of the flexible support 202 only for tilt about the axis formed by the two support pins. With three or more support pins 430, the components of the flexible supports 202 can be adjusted in three dimensions, such that the parallelism of the top surface 502 may advantageously controlled.

FIG. 6 is a side view of a flexible support 202 of FIG. 4 when an overlying susceptor 204 touches a first support block 402 of the flexible support 202 at a single point while leaving a space along an upper surface 602 of the first support block 402. This causes a leftmost support pin 604 (i.e., the support pin 604 to be compressed more than the other support pins 606 (i.e. the other support pins 606 underlying the single point of contract) of the flexible support 202. The associated nut 608 of the leftmost support pin 604 can be adjusted to a new position such that the susceptor 204 touches the upper surface 602 of the first support block 402 in at least two points and the angle α between the first support block 402 and the second support block 418 is zero degrees as shown in FIG. 7. As noted above, the distance between the first support block 402 and the second support block 418 set by each of the support pins 604, 606 determines a deviation in parallelism between the overlying susceptor 204 and the underlying granite table 206. The differences in the distances translates to an acute angle α between a plane containing the susceptor 204 and a plane containing the granite table 206, or by a second vertical distance from the horizontal of an upper surface of the susceptor 204 as measured by a Hamar laser 210 (210 shown in FIG. 2). The deviation in parallelism is further indicated by the number of points on the upper surface 602 of the first support block 402 that touch a bottom surface of the susceptor 204.

FIG. 8 is a side view of an exemplary flexible support 802, according to another embodiment. The flexible support 802 comprises a first support block 803. The first support block 803 has a substantially cylindrical base 804 having an upper surface 806 and a lower surface 808. The base 804 is disposed on a substantially cylindrical ring 810, the base 804 and the ring 810 having an outer diameter D1. The ring 810 has an outer surface 812, an inner surface 814 having an inner diameter D2, and a bottom surface 815. The ring 810 has a height H1 extending from the base 804. The lower surface 808 of the base 804 and the inner surface 814 of the ring 810 form an aperture 816 having the diameter D2.

The flexible support 802 further comprises a second support block 818. The second support block 818 has a substantially cylindrical base 820 having an upper surface 822 and a lower surface 824. The base 820 has an outer diameter D3 which may substantially be the same as the diameter D1 of the first support block 803. A substantially cylindrical guide 826 in the form of a ring is disposed on the base 820. The guide 826 has an outer diameter D4 which is smaller than the diameter D3 and an inner diameter D5 which is smaller than the outer diameter D4. The outer diameter D4 is selected to allow the second support block 818 to coaxially ride along the inner diameter D2 of the ring 810. The guide 826 has an outer surface 828, an inner surface 829, and an upper surface 831. The guide 826 has a height H2 extending from the base 820. The upper surface 822 of the base 820 and the inner surface 829 of the guide 826 form an aperture 832 having the diameter D5. A threaded aperture 844 is formed in the upper surface 822 of the base 820 within the aperture 832.

The flexible support 802 further comprises a screw-mounted support pin 836. The support pin 836 has an upper section 838 having an upper surface that is configured to contact the lower surface 808 of the base 804 within the aperture 816 of the first support block 803 and a lower section 840 disposed below a mechanical stop 842 and the upper section 838 of the support pin 836. Optionally, the upper section 838 may be configured to extend into the base 804, and may in some examples, thread into the base 804. The mechanical stop 842 may be a flange, external retaining ring, pin, nut or other feature that secures the pin 836 relative to the base 820. The lower section 840 may include a threaded. The threaded lower section 840 is configured thread into a threaded aperture 844 formed in the base 820 of the second support block 818. Thus, the pin 836 may be tightly secured to the base 820 as a result of stop 842 coming in contact with the upper surface 822 of the base 820 of the second support block 818. The height H3 of the upper section 838 is larger than the height H1 of the ring 810 and the height H2 of the guide 826, such that the force born on the upper surface 806 of the first support block 803 is carried entirely on the pin 836.

The first support block 803 is configured to be fit to the ring 810 face down about the second support block 818 overlying the upper section 838 of the support pin 836. The guide 826 has a slightly smaller outer diameter D4 than the inner diameter D2 of the ring 810 such that the outer surface 828 of the guide 826 has a small clearance with the inner surface 814 of the ring 810. Accordingly, the first support block 803 is coaxially slidably on the second support block 818 by the presence of a gap 846 between the outer surface 828 of the guide 826 and the inner surface 814 of the ring 810. The upper section 838 has a height H3 above the mechanical stop 842 that is larger than the height H1 of the ring 810 and the height H2 of the guide 826. The differences in heights permit the formation of a clearance gap 848 between the lower surface 808 of the base 804 of the first support block 803 and the upper surface 831 of the guide 826 in the second support block 818. The differences in heights also permit the formation of a clearance gap 850 between the bottom surface 815 of the ring 810 in the first support block 803 and the upper surface 822 of the base 820 of the second support block 818.

The clearance gaps 848, 850 permit the first support block 803 to pivot on the support pin 836 without initially coming in contact with the second support block 818. Additionally, clearance gaps 848, 850 permit the support pin 836 to be elastically compressed by as much as the size of the clearance gaps 848, 850, while the size of the clearance gaps 848, 850 prevents over-compression and failure of the support pin 836. When the first support block 803 is pivoted to a final position and the support pin 836 is compressed to a final position, the compressed support pin 836 sets a distance between the first support block 803 and the second support block 818. The distance determines a deviation in parallelism between the upper surface 406 of the first support block 803 and the lower surface 422 of the second support block 818 as measured by the compressed height of the support pin 836.

The material and geometry of support pin 836 is selected as discussed above with reference to the support pin 430. For example, the material and geometry of support pin 836 may be made of aluminum and configured in a diameter, sectional profile and length that allows for the accurate testing of the susceptor 204. Although a single axially located pin 836 is illustrated in FIG. 8, additional support pins 836 may be employed in a given flexible support 802. The support pin 836 may also be replaced with one or more pins of different diameters and lengths to allow testing of different susceptors.

While the foregoing is directed to examples of the present disclosure, other and further examples of the disclosure may be devised without departing from the basic scope thereof, and the scope thereof is determined by the claims that follow.

What is claimed is:

1. A flexible support for obtaining a flatness measurement of a susceptor, comprising:
    a first support block having a flat upper surface and a lower surface having a first aperture formed therein;
    a second support block having a flat lower surface and an upper surface having a second aperture formed therein;
    a support pin configured to be receivable in the first aperture and the second aperture, the support pin configured to retain the first support block and the second support block in a spaced apart relation while allowing restricted motion of the first support block relative to the second support block via deformation of the support pin; and
    a guide disposed between the first support block and the second support block, the guide configured to allow the first support block and the second support block to move axially relative to the guide.

2. The flexible support of claim 1, further comprising a mechanical stop configured to restrain the support pin relative to the second support block.

3. The flexible support of claim 2, wherein the mechanical stop is configured to set a distance spacing the first support block from the second support block.

4. The flexible support of claim 1, wherein the support pin is adjustable to set a parallelism defined between the upper surface of the first support block and lower surface of the second support block.

5. The flexible support of claim 1, wherein the support pin is adjustable to set an acute angle between a plane containing the upper surface of the first support block and a plane containing the lower surface of the second support block.

6. The flexible support of claim 1, wherein the guide is further configured to restrict lateral movement between the first support block and the second support block.

7. The flexible support of claim 1, wherein the first support block comprises:
    a cylindrical upper sub-block having a first diameter and disposed on a cylindrical lower support block having a second diameter less than the first diameter.

8. The flexible support of claim 7, wherein the second support block is cylindrical and has a diameter that matches the first diameter of the of the first support block.

9. The flexible support of claim 1, wherein the guide is a solid cylinder.

10. The flexible support of claim 1, wherein the guide is a cylindrical ring.

11. The flexible support of claim 1, wherein the support pin is replaceable.

12. The flexible support of claim 1 further comprising:
    a baseplate fastener screw configured to secure the first support block to the second support block.

13. An apparatus for obtaining a flatness measurement of a susceptor, comprising:
    a flat and hard table;
    a plurality of flexible supports disposed on the table, wherein each of the flexible supports comprises:
        a first support block having a flat upper surface and a lower surface having a first aperture formed therein;
        a second support block having a flat lower surface and an upper surface having a second aperture formed therein;
        a support pin configured to be receivable in the first aperture and the second aperture, the support pin configured to retain the first support block and the second support block in a spaced apart relation while allowing restricted motion of the first support block relative to the second support block via deformation of the support pin; and
        a guide disposed between the first support block and the second support block, the guide configured to allow the first support block and the second support block to move axially relative to the guide; and
    the susceptor overlying the plurality of flexible supports.

14. The apparatus of claim 13, wherein each of the flexible supports further comprises a mechanical stop configured to restrain the support pin relative to the second support block.

15. The apparatus of claim 14, wherein the mechanical stop is configured to set a distance spacing the first support block from the second support block.

16. The apparatus of claim 13, wherein the support pin is adjustable to set a parallelism defined between the upper surface of the first support block and lower surface of the second support block.

17. The apparatus of claim 13, wherein the support pin is adjustable to set an acute angle between a plane containing the upper surface of the first support block and a plane containing the lower surface of the second support block.

18. The apparatus of claim 13, wherein the guide is further configured to restrict lateral movement between the first support block and the second support block.

19. An apparatus for obtaining a flatness measurement of a susceptor, comprising:
   a flat and hard table;
   a plurality of flexible supports disposed on the table, wherein each of the flexible supports comprises:
      a first support block having a flat upper surface and a lower surface having a first aperture formed therein;
      a second support block having a flat lower surface and an upper surface having a second aperture formed therein;
      a support pin configured to be receivable in the first aperture and the second aperture, the support pin configured to retain the first support block and the second support block in a spaced apart relation while allowing restricted motion of the first support block relative to the second support block via deformation of the support pin; and
      a guide disposed between the first support block and the second support block, the guide configured to allow the first support block and the second support block to move axially relative to the guide;
   the susceptor overlying the plurality of flexible supports; and
   a laser above an upper surface of the susceptor.

20. The apparatus of claim 19, wherein each of the flexible supports further comprises a mechanical stop configured to restrain the support pin relative to the second support block.

* * * * *